(12) United States Patent
Yu

(10) Patent No.: US 11,206,741 B2
(45) Date of Patent: Dec. 21, 2021

(54) DISPLAY

(71) Applicant: Au Optronics Corporation, Hsinchu (TW)

(72) Inventor: Ming-Hsuan Yu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/907,172

(22) Filed: Jun. 20, 2020

(65) Prior Publication Data

US 2021/0022258 A1 Jan. 21, 2021

Related U.S. Application Data

(60) Provisional application No. 62/874,677, filed on Jul. 16, 2019.

(30) Foreign Application Priority Data

Mar. 3, 2020 (TW) .................. 109106891

(51) Int. Cl.
*H05K 7/02* (2006.01)
*H05K 7/04* (2006.01)
*H05K 5/02* (2006.01)
*H01F 7/02* (2006.01)
*H01F 7/06* (2006.01)
*H05K 5/00* (2006.01)

(52) U.S. Cl.
CPC ............. *H05K 5/0217* (2013.01); *H01F 7/02* (2013.01); *H01F 7/06* (2013.01); *H05K 5/0017* (2013.01)

(58) Field of Classification Search
USPC ................................................ 361/807, 810
See application file for complete search history.

(56) References Cited

U.S. PATENT DOCUMENTS

| | | |
|---|---|---|
| 10,223,942 B2 | 3/2019 | Chu |
| 10,321,583 B2 | 6/2019 | Seo et al. |
| 10,334,090 B2 | 6/2019 | Kikuchi |
| 2013/0010405 A1* | 1/2013 | Rothkopf ............. H05K 5/0226 361/679.01 |
| 2014/0210577 A1* | 7/2014 | Peng ...................... H01F 7/0215 335/285 |
| 2017/0278436 A1 | 9/2017 | Chu |
| 2018/0103550 A1 | 4/2018 | Seo et al. |
| 2018/0107250 A1* | 4/2018 | Cho ......................... G09F 9/301 |
| 2018/0375976 A1 | 12/2018 | Kikuchi |

(Continued)

FOREIGN PATENT DOCUMENTS

| CN | 104732890 | 6/2015 |
|---|---|---|
| CN | 206541552 | 10/2017 |

(Continued)

*Primary Examiner* — Hung S. Bui
(74) *Attorney, Agent, or Firm* — JCIPRNET

(57) ABSTRACT

The disclosure provides a display including a carrying main body, a flexible display panel, at least one magnet, and a plurality of electromagnets. The flexible display panel is disposed on the carrying main body and is adapted to unfold on the carrying main body. The at least one magnet is disposed on the flexible display panel. The electromagnets are disposed on the carrying main body. Magnetic poles of the electromagnets are adapted to change and drive the at least one magnet and the flexible display panel to move relatively to the carrying main body.

13 Claims, 14 Drawing Sheets

(56) References Cited

U.S. PATENT DOCUMENTS

2019/0086966 A1* 3/2019 Lin .................... H04M 1/0214
2019/0286195 A1* 9/2019 Lin ....................... G06F 1/1652
2020/0110444 A1* 4/2020 Jia ....................... H04M 1/0268

FOREIGN PATENT DOCUMENTS

| CN | 107919065 | 4/2018 |
| CN | 108648628 | 10/2018 |
| CN | 109845234 | 6/2019 |

* cited by examiner

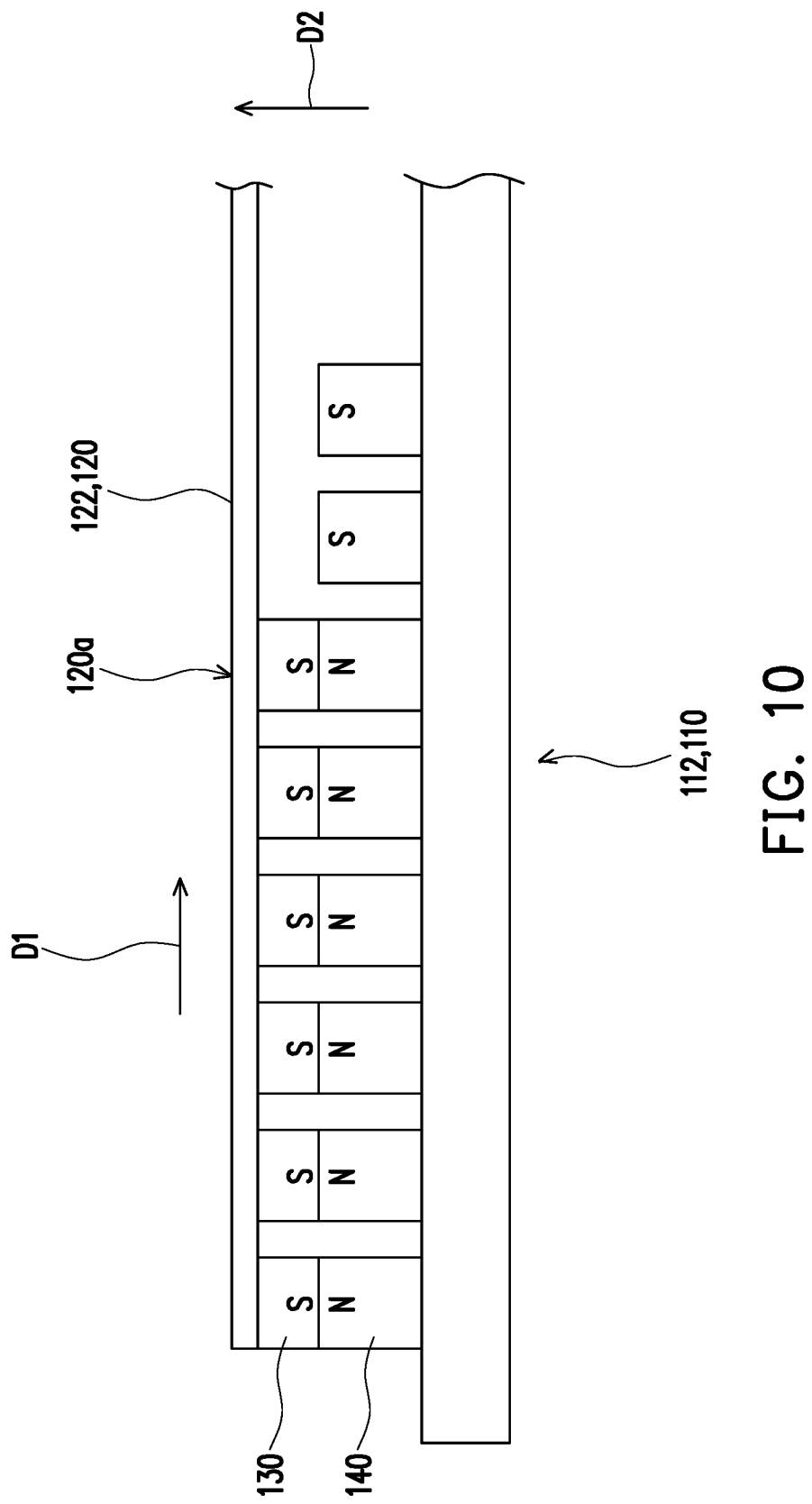

DISPLAY

CROSS-REFERENCE TO RELATED APPLICATION

This application claims the priority benefits of U.S. provisional application Ser. No. 62/874,677, filed on Jul. 16, 2019 and Taiwan application serial no. 109106891, filed on Mar. 3, 2020. The entirety of each of the above-mentioned patent applications is hereby incorporated by reference herein and made a part of this specification.

BACKGROUND

Technical Field

The disclosure relates to a display, and particularly to a display including a flexible display panel.

Description of Related Art

Along with the development of the process of display panel, the technique of manufacturing flexible display panel has gradually matured, such that flexible display panels are becoming generalized among consumer products. A flexible display panel may be applied to foldable electronic devices, such as foldable phones and tablets. It may be disposed to two bodies of an electronic device at the same time and may be bent flexibly along with the unfolding and closing of the two bodies.

In some foldable electronic devices, a flexible display panel is designed to glide relatively to the two bodies in order for the bodies and the flexible display panel to unfold and close smoothly. Generally speaking, it is necessary to dispose a sliding track at the bezel of a body for the flexible display panel to complete the gliding movement. However, such design increases the thickness of the bezel of the body and also causes the side margins of the flexible display panel to be abraded at the sliding track during the gliding movement. In addition, since flexible display panels may glide freely along the gliding track, the location where the flexible display panel bends is also prone to change.

SUMMARY

Accordingly, the disclosure provides a display to decrease the thickness of the bezel of the body, to avoid abrasion of the side margins of the flexible display panel, and also to avoid the change in the location where the flexible display panel bends.

The display panel of the disclosure includes a carrying main body, a flexible display panel, at least one magnet, and a plurality of electromagnets. The flexible display panel is disposed to the carrying main body and is adapted to unfold on the carrying main body. The at least one magnet is disposed on the flexible display panel. The electromagnets are disposed on the carrying main body. Magnetic poles of the electromagnets are adapted to change and drive the at least one magnet and the flexible display panel to move relatively to the carrying main body.

In an embodiment of the disclosure, the aforementioned carrying main body includes two bodies pivotally connected to each other, in which a first section of the flexible display panel is disposed on one of the two bodies and a second section of the flexible display panel is disposed on the other one of the two bodies, and the flexible display panel is adapted to glide and unfold relatively to the two bodies along with the relative unfolding of the two bodies, and is adapted to glide and fold between the two bodies relatively to the two bodies along with the relative closing of the two bodies.

In an embodiment of the disclosure, part of electromagnets is disposed to a body, and the other part of the electromagnets is disposed to another body, and at least one magnet includes at least two magnets, and the at least two magnets are disposed respectively in the first section of the flexible display panel and the second section of the flexible display panel.

In an embodiment of the disclosure, the aforementioned two bodies are pivotally connected to each other along a pivot axis, and each of the two bodies has two side margins which are on opposite sides, and each side margin extends along a direction perpendicular to the pivot axis, and the electromagnets are disposed to at least one side margin and are arranged along the direction in sequence.

In an embodiment of the disclosure, the aforementioned display includes a control element adapted to control a change in magnetic poles of electromagnets along with the increase or decrease of an unfolding angle of the two bodies.

In an embodiment of the disclosure, the aforementioned display includes a sensing element adapted to sense an unfolding angle.

In an embodiment of the disclosure, the aforementioned carrying main body includes a pivot by which the two bodies are pivotally connected to each other, the sensing element is disposed to the pivot and is adapted to sense a torque value of the pivot, and the torque value is related to the unfolding angle.

In an embodiment of the disclosure, the aforementioned carrying main body includes a roller and a body, and a flexible display panel is rolled and collected to the roller and is adapted to unfold from the roller onto the body.

In an embodiment of the disclosure, part of the electromagnets is disposed to the roller, and the other part of the electromagnets is disposed to the body.

In an embodiment of the disclosure, the aforementioned carrying main body includes another body and a pivot, the two bodies are pivotally connected to each other by a pivot, and a roller is disposed within the pivot.

In an embodiment of the disclosure, the aforementioned display includes a control element, in which the electromagnets are arranged along a direction in sequence, and the control element is adapted to control at least part of magnetic poles of the electromagnets to change and drive at least one magnet and the flexible display panel to move along the direction.

In an embodiment of the disclosure, the size of the at least one magnet arranged along the direction is bigger than the size of each of the electromagnets arranged along the direction.

In an embodiment of the disclosure, in a direction perpendicular to a display surface of the flexible display panel, at least one magnet overlaps with part of the electromagnets.

Based on the above, in the display of the disclosure, the carrying main body is disposed with the electromagnets and the flexible display panel is disposed with the magnets, such that the flexible display panel may not be disengaged from the carrying main body with magnetic attraction between the electromagnets and the magnets. The flexible display panel may be disposed to unfold or fold between the two bodies along with the opening and closing of the two bodies. With such disposition, magnetic poles of each electromagnet may be changed, and with magnetic repulsion produced by part of the electromagnets toward the magnets on the flexible display panel, the flexible display panel may glide relatively to the body, such that the two bodies and the flexible display panel may unfold and close smoothly. Accordingly, it is not necessary to dispose a sliding track at the bezel of the body for the flexible display panel to glide, thereby decreasing the thickness of the body at the bezel and also avoiding abrasion of the side margins of the flexible display panel at the sliding track. In addition, since the gliding stroke of the flexible display panel is controlled according to the set change in magnetic poles of the electromagnets, the location where the flexible display panel bends may be avoided to change. Furthermore, the flexible display panel may be disposed to be adapted to be rolled and collected to the roller or to unfold from the roller onto the body. With such disposition, magnetic poles of each electromagnet may be changed, and, with magnetic repulsion produced by part of the electromagnets toward the magnets on the flexible display panel, the flexible display panel may glide relatively to the body and the roller, such that the flexible display panel may unfold and close smoothly.

The accompanying drawings are included to provide a further understanding of the disclosure, and are incorporated in and constitute a part of this specification. The drawings illustrate embodiments of the disclosure and, together with the description, serve to explain the principles of the disclosure.

BRIEF DESCRIPTION OF THE DRAWINGS

FIG. 10 is a schematic view of part of a display according to another embodiment of the disclosure.

DESCRIPTION OF THE EMBODIMENTS

Figure 1:
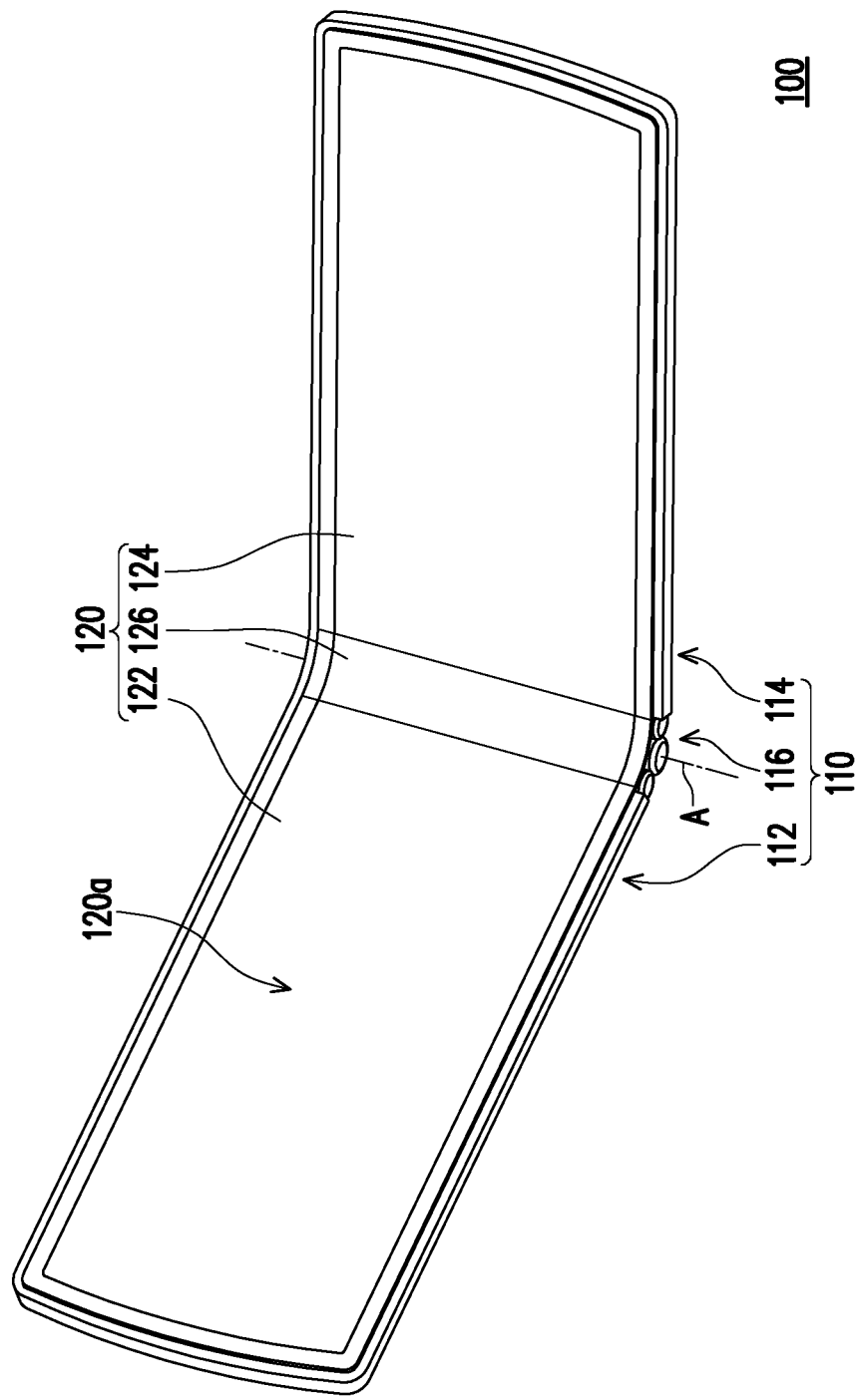
FIG. 1 is a stereogram of a display according to an embodiment of the disclosure.
Figure 2:
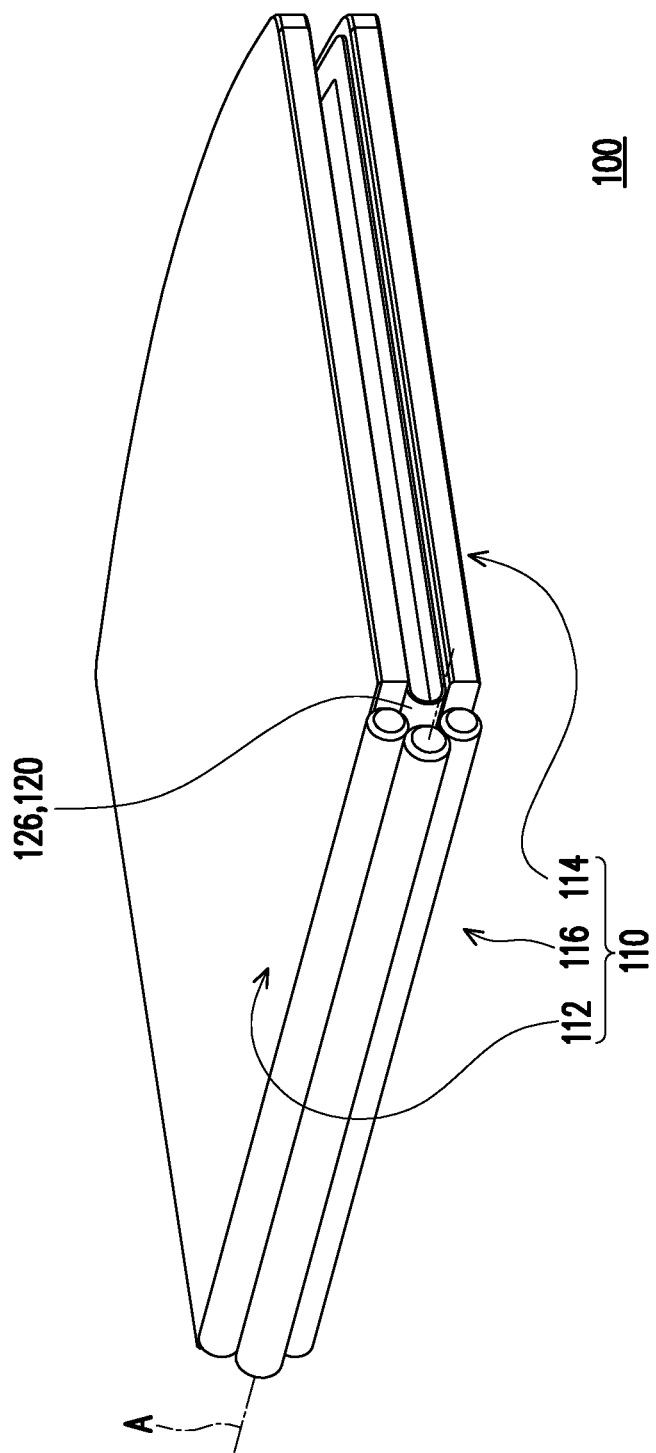
FIG. 2 illustrates a relative closing of the two bodies according to FIG. 1.

FIG. 1 is a stereogram of a display according to an embodiment of the disclosure. FIG. 2 illustrates a relative closing of the two bodies according to FIG. 1. Referring to FIG. 1 and FIG. 2, a display 100 of the present embodiment may be, for example, a smart phone or a tablet, and includes a carrying main body 110 and a flexible display pane 120. The carrying main body 110 includes two bodies 112 and 114 and a pivot 116. The two bodies 112 and 114 are pivotally connected to each other by the pivot 116 along a pivot axis A. Part of the flexible display panel 120 is disposed to the body 112 of the carrying main body 110, and another part of the flexible display panel 120 is disposed to the body 114 of the carrying main body 110. The flexible display panel 120 may unfold on the two bodies 112 and 114 along with the relative unfolding of the two bodies 112 and 114 as shown in FIG. 1, and may fold between the two bodies 112 and 114 along with the relative closing of the two bodies 112 and 114 as shown in FIG. 2.

Specifically speaking, the flexible display panel 120 includes a first section 122, a second section 124, and a third section 126, as shown in FIG. 1. The first section 122 is disposed to the body 112, the second section 124 is disposed to the body 114, and the third section 126 is connected between the first section 122 and the second section 124. The flexible display panel 120 unfolds and folds, for example, by bending the third section 126. According to different display modes, the first section 122 and the second section 124 may display respectively different images, or, the first section 122, the second section 124, and the third section 126 may display a single image altogether.

Figure 3:
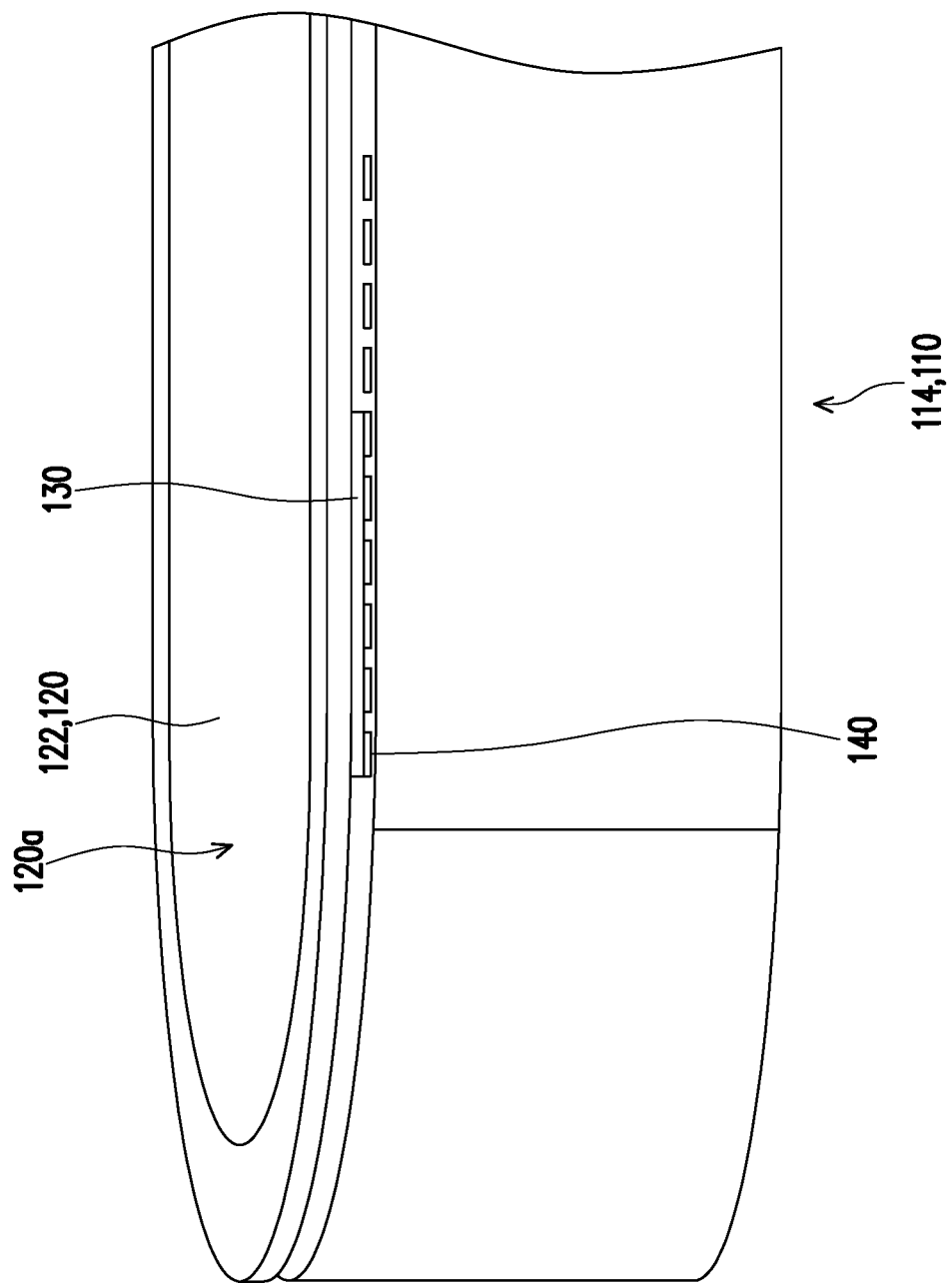
FIG. 3 is a stereogram of part of the display according to FIG. 1.
Figure 4:
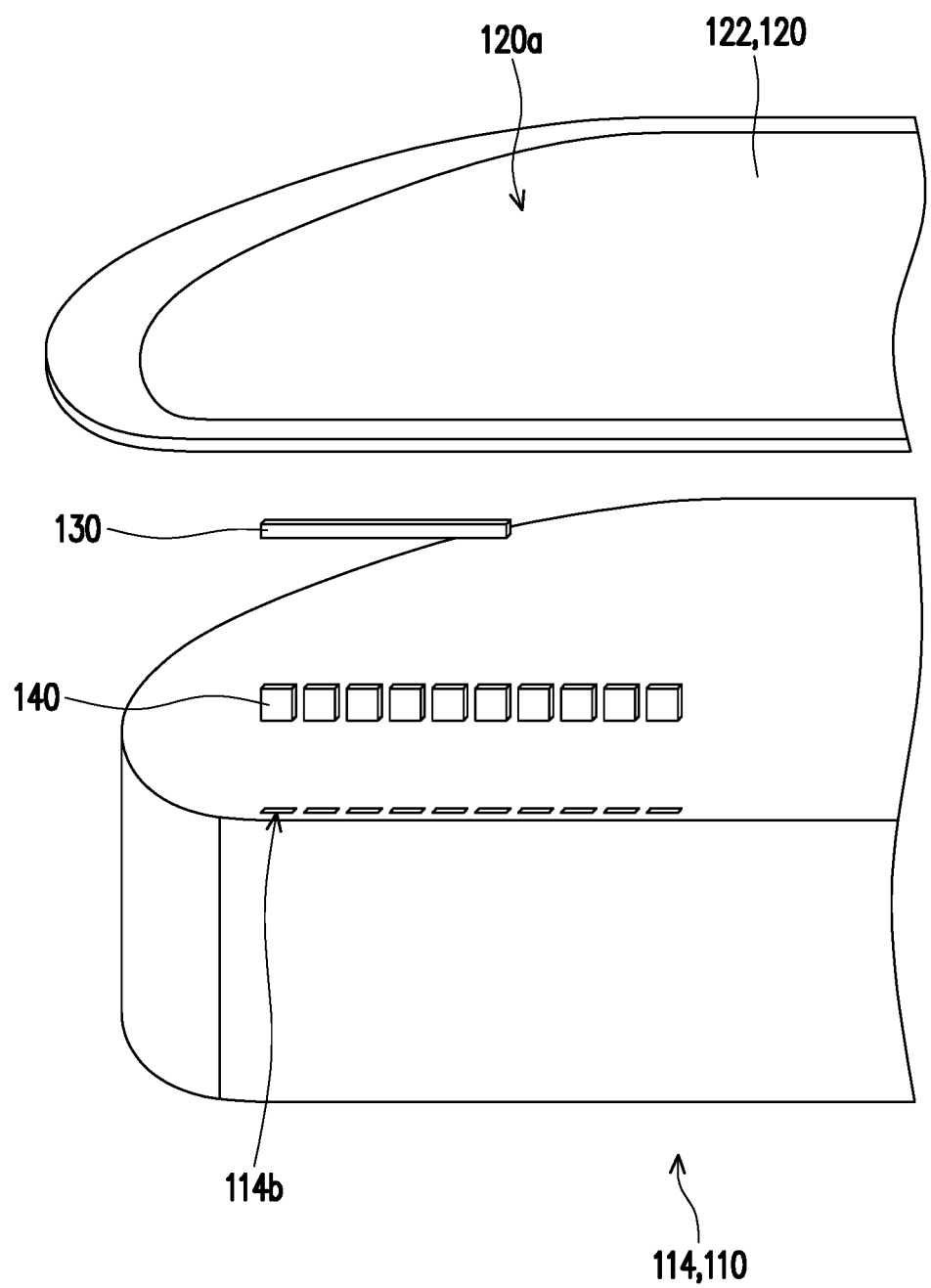
FIG. 4 is an exploded-view drawing of the display according to FIG. 3.
Figure 5:
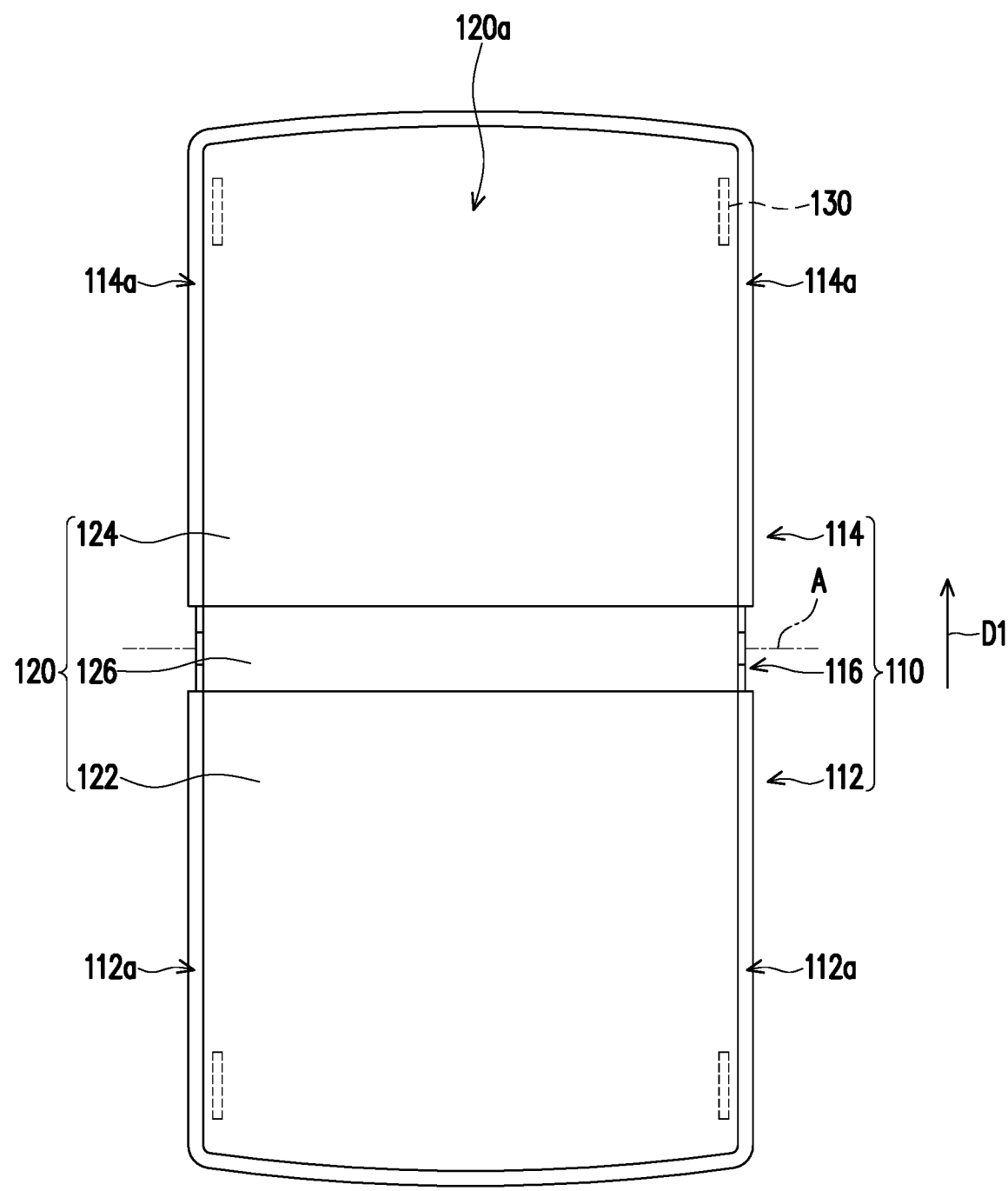
FIG. 5 is a top view of the display according to FIG. 1.
Figure 6:
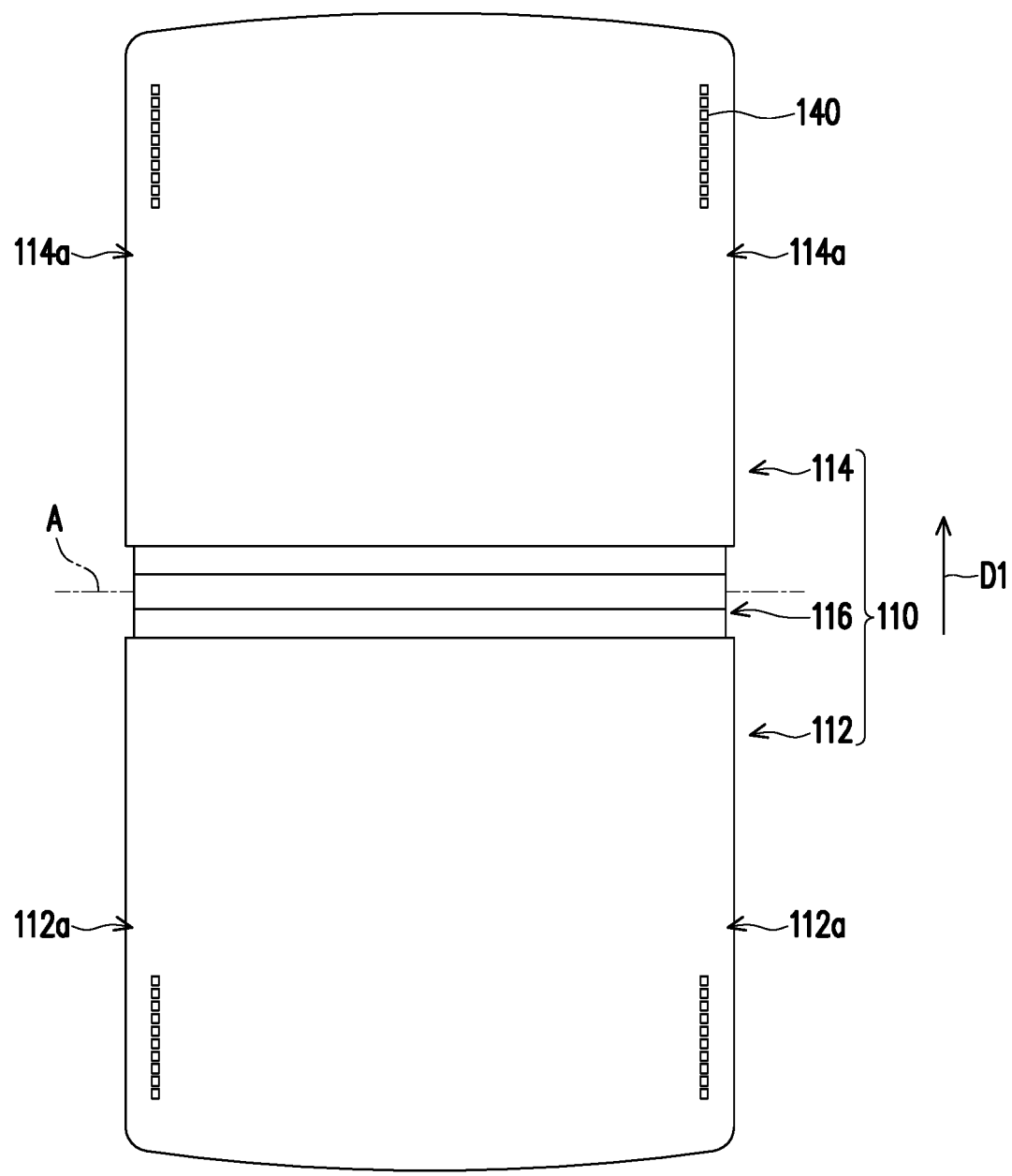
FIG. 6 is a schematic view of part of members of the display according to FIG. 5.

FIG. 3 is a stereogram of part of the display according to FIG. 1. FIG. 4 is an exploded-view drawing of the display according to FIG. 3. FIG. 5 is a top view of the display according to FIG. 1. FIG. 6 is a schematic view of part of members of the display according to FIG. 5. Referring to FIG. 3 to FIG. 6, the display of the present embodiment further includes at least one magnet 130 (illustrated to be multiple ones) and a plurality of electromagnets 140. Part of the magnets 130 is disposed in the first section 122 of the flexible display panel 120, and the other part of the magnets 130 is disposed in the second section 124 of the flexible display panel 120. Part of the electromagnets 140 is disposed to the body 112 of the carrying main body 110 and is corresponding to the magnets 130 in the first section 122, and the other part of the electromagnets 140 is disposed to the body 114 of the carrying main body 110 and is corresponding to the magnets 130 in the second section 124. Magnetic poles of the electromagnets 140 are adapted to be changed and drive the magnets 130 and the flexible display panel 120 to move relatively to the carrying main body 110. In the present embodiment, the magnets 130 are fixed on the flexible display panel 120, for example, by gluing, and the electromagnets 140 are fixed on the bodies 112 and 114, for example, by gluing. However, the disclosure is not limited to the ways of fixing the magnets 130 and the electromagnets 140.

As stated above, the bodies 112 and 114 are disposed with the electromagnets 140 and the flexible display panel 120 is disposed with the magnets 130, such that the flexible display panel 120 may not be disengaged from the bodies 112 and 114 with magnetic attraction between the electromagnets 140 and the magnets 130. Furthermore, magnetic poles of each electromagnet 140 may be changed, and, with magnetic repulsion produced by part of the electromagnets 140 toward the magnets 130 on the flexible display panel 120, the flexible display panel 120 may glide relatively to the bodies 112 and 114, such that the two bodies 112 and 114 and the flexible display panel 120 may unfold and close smoothly. Accordingly, it is unnecessary to dispose a sliding track at the bezel of the bodies 112 and 114 for the flexible display panel 120 to glide, thereby decreasing the thickness of the bodies 112 and 114 at the bezel and also avoiding abrasion of the side margins of the flexible display panel 120 at the sliding track. In addition, since the gliding stroke of the flexible display panel 120 is controlled according to set ways of the change in magnetic poles of the electromagnets 140, the location (i.e., the third section 126) where the flexible display panel 120 bends may be avoided to change.

In the present embodiment, the body 112 has two side margins 112a which are on opposite sides (as shown in FIG. 5 and FIG. 6), and the body 114 has two side margins 114a which are on opposite sides (as shown in FIG. 5 and FIG. 6). Each of the side margins 112a and 114a extends along a direction D1 perpendicular to the pivot axis A and perpendicular to the display surface 120a of the flexible display panel 120, and the electromagnets 140 are disposed respectively to the side margins 112a and 114a and are arranged along the direction D1 in sequence, as shown in FIG. 6. In addition, the body 114 of the present embodiment may have a plurality of notches 114b for inserting the electromagnets 140, as shown in FIG. 4. The body 112 may also have the same notches for inserting the electromagnets 140.

Figure 7:
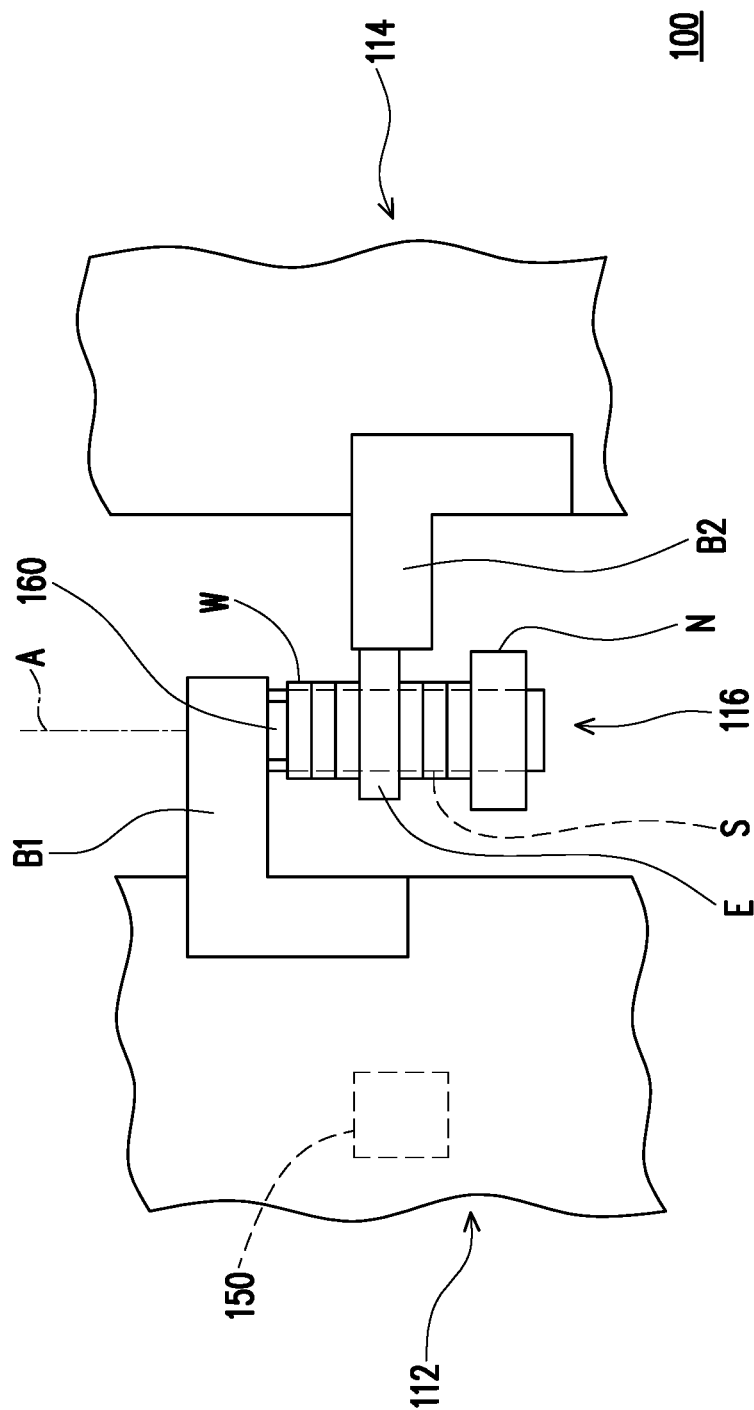
FIG. 7 is a schematic view of part of members of the display according to FIG. 1.

FIG. 7 is a schematic view of part of members of the display according to FIG. 1. The display 100 of the present embodiment includes a control element 150, as shown in FIG. 7. The control element 150 is, for example, a central processing unit or other control chips, and is adapted to control the change in magnetic poles of the electromagnets 140 along with increase or decrease of the unfolding angle of the two bodies 112 and 114, driving the flexible display panel 120 to glide relatively to the bodies 112 and 114 as described above.

Specifically speaking, the display 100 further includes a sensing element 160, as shown in FIG. 7. A rotating shaft S of the pivot 116 is connected to a bracket B1 of the body 112. The rotating shaft S has, for example, screw threads for an end E of a bracket B2 of the body 114 to turn and screw into the rotating shaft S. A plurality of elastic pieces W sheathes the rotating shaft S and is tightly fixed by a nut N screwed on the end of the rotating shaft S, through which the torque needed by the pivot 116 is provided. The sensing element 160 is, for example, a pressure sensing element and is disposed within the pivot 116 and is located between the bracket B1 and the elastic pieces W. The control element 150 is disposed to the body 112 and is coupled to the sensing element 160 and the electromagnets 140.

When the two bodies 112 and 114 gradually close, changing from the unfolding state as shown in FIG. 1 into the closing state as shown in FIG. 2, the unfolding angle of the two bodies 112 and 114 gradually decreases. In contrast, when the two bodies 112 and 114 gradually unfold, changing from the closing state as shown in FIG. 2 into the unfolding state as shown in FIG. 1, the unfolding angle of the two bodies 112 and 114 gradually increases. During the unfolding and closing processes, the end E of the bracket B2 turns along the screw threads of the rotating shaft S and changes the pressure exerted toward the bracket B2 to the elastic pieces W, producing a change in the torque value of the pivot 116. In other words, the torque value of the pivot 116 is related to the unfolding angle of the two bodies 112 and 114. The sensing element 160 pressured by the elastic pieces W is adapted to sense a change in the torque value and infer the unfolding angle of the two bodies 112 and 114 at the moment, and sends a corresponding sensing signal to the control element 150 for the control element 150 to control accordingly the change in magnetic poles of the electromagnets 140. In other embodiments, other types of sensing elements may be disposed to sense the unfolding angle between the two bodies 112 and 114. The disclosure is not limited thereto.

Figure 8A:
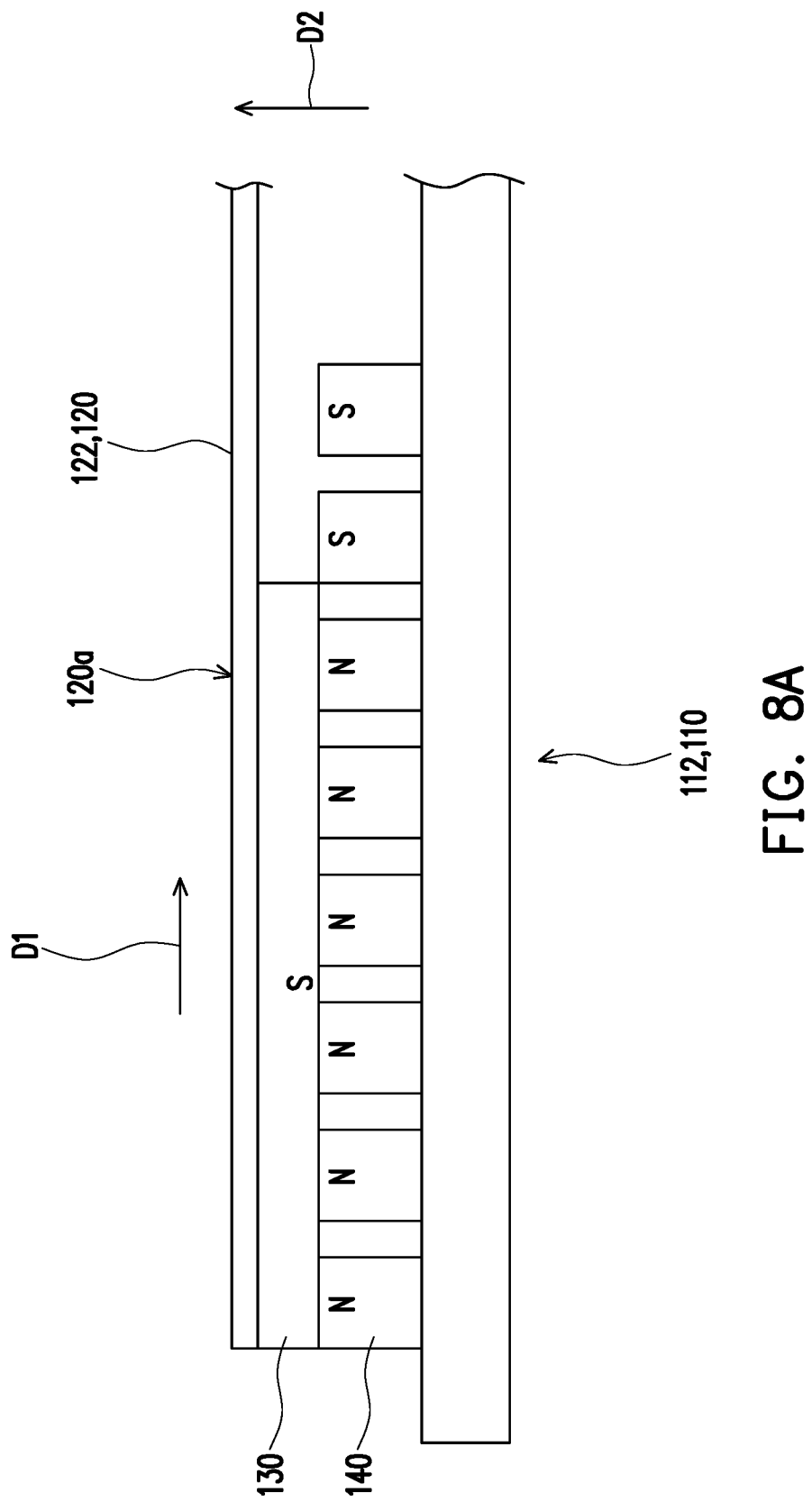
FIG. 8A to FIG. 8C illustrate a change in magnetic poles of the electromagnets according to FIG. 3.
Figure 8B:
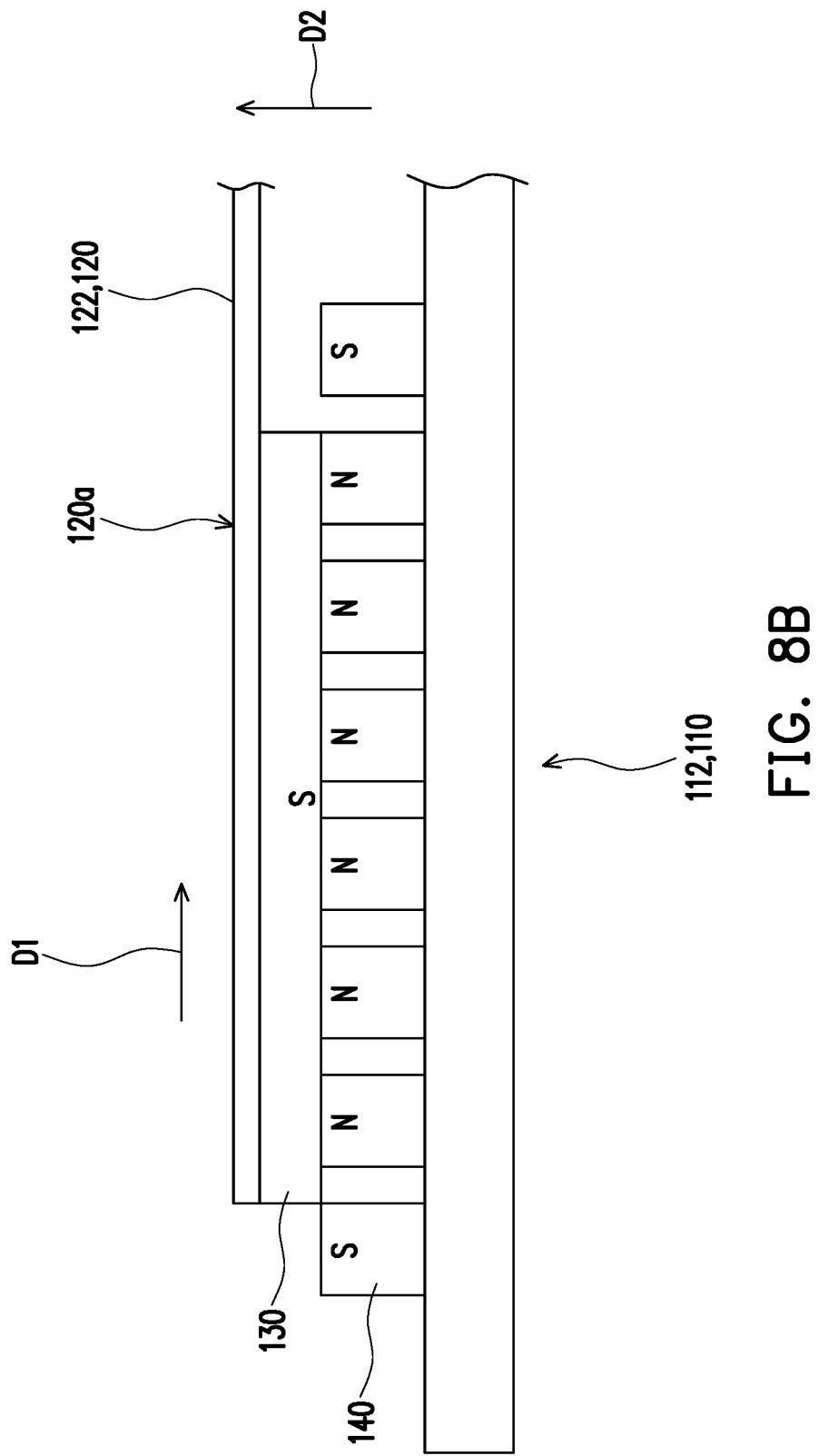
Figure 8C:
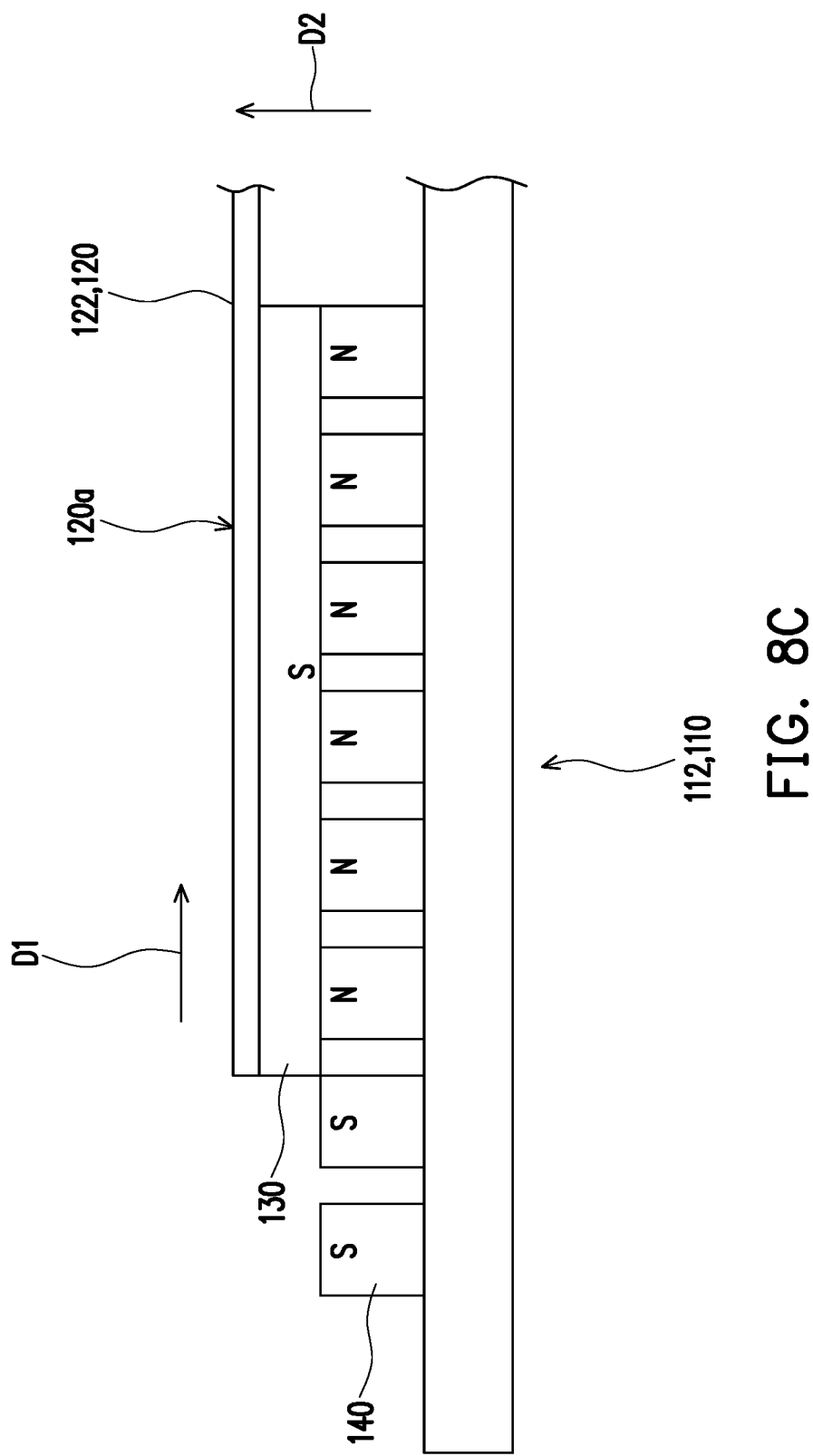

FIG. 8A to FIG. 8C illustrate a change in magnetic poles of the electromagnets according to FIG. 3. Specifically speaking, when the unfolding angle between the two bodies 112 and 114 gradually decreases, the control element 150 controls the change in magnetic poles of part of the electromagnets 140 along the direction D1 in sequence as shown from FIG. 8A to FIG. 8C, using magnetic repulsion between part of the electromagnets 140 and the magnets 130 as well as magnetic attraction between the other part of the electromagnets 140 and the magnets 130 to drive the magnets 130 and the flexible display panel 120 to move along the direction D1, such that the two bodies 112 and 114 and the flexible display panel 120 may close smoothly. In contrast, when the unfolding angle between the two bodies 112 and 114 gradually increases, the control element 150 controls the change in magnetic poles of part of the electromagnets 140 along a reverse of the direction D1 in sequence as shown from FIG. 8C to FIG. 8A, using magnetic repulsion between part of the electromagnets 140 and the magnets 130 as well as magnetic attraction between the other part of the electromagnets 140 and the magnets 130 to drive the magnets 130 and the flexible display panel 120 to move along the reverse of the direction D1, such that the two bodies 112 and 114 and the flexible display panel 120 may unfold smoothly.

In the present embodiment, the size of each magnet 130 arranged along the direction D1 is bigger than the size of each electromagnet 140 arranged along the direction D1, such that each magnet 130 may overlap with multiple electromagnets 140 along a direction D2 perpendicular to the display surface 120a of the flexible display panel 120, as shown in FIG. 8A. The disclosure is not limited to the quantity of the magnets 130 and the relative size relation between the magnets 130 and the electromagnets 140, which is described as follows with reference to the drawings.

Figure 9:
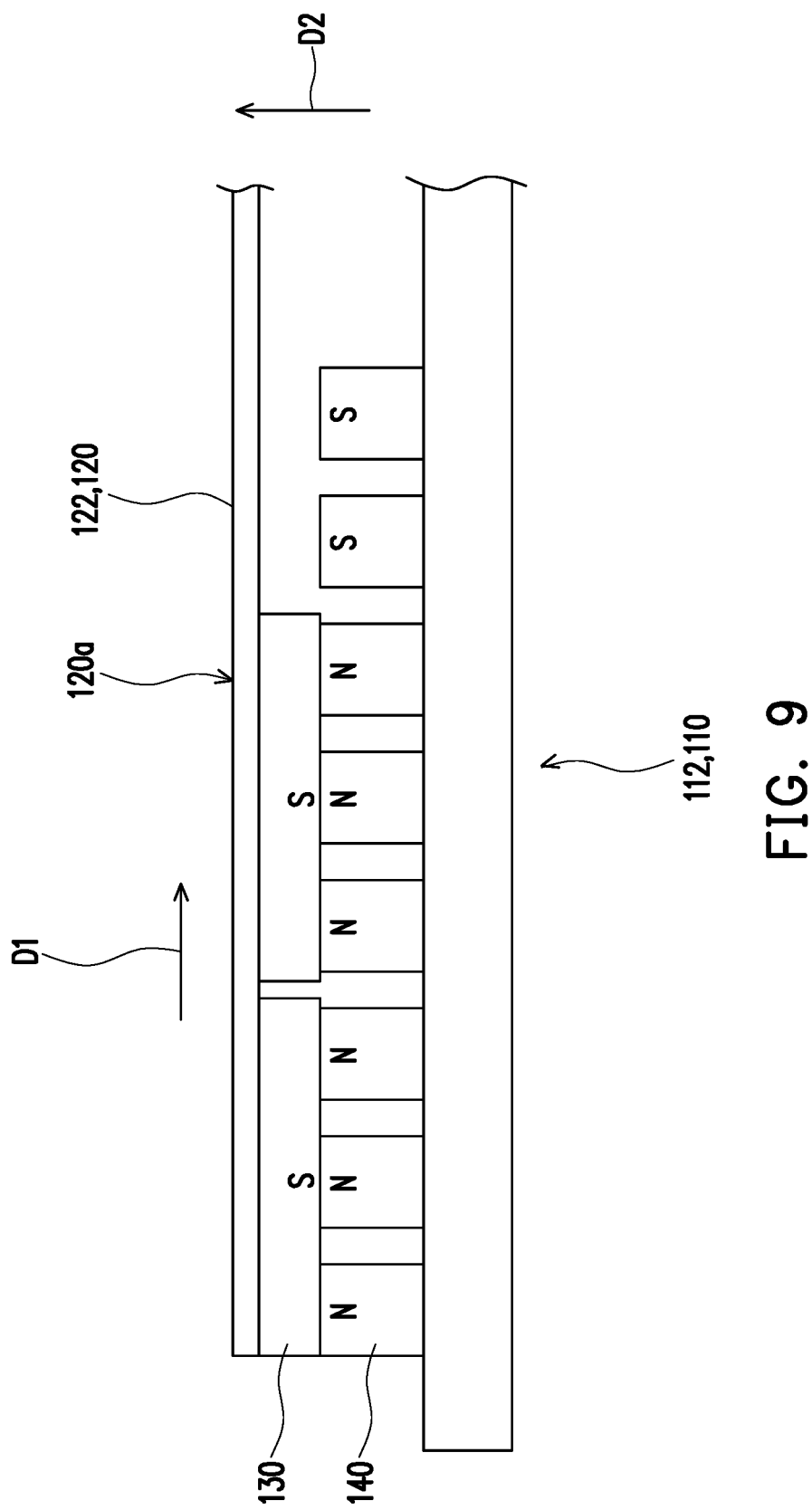
FIG. 9 is a schematic view of part of a display according to another embodiment of the disclosure.

FIG. 9 is a schematic view of part of a display according to another embodiment of the disclosure. The differences between the embodiment shown in FIG. 9 and the embodiment shown in FIG. 8A are that the quantity of magnets 130 in FIG. 9 (illustrated as two) is larger than the quantity of the magnets 130 in FIG. 8A, and that the size of each magnet 130 arranged along a direction D1 in FIG. 9 is smaller than the size of each magnet 130 arranged along the direction D1 in FIG. 8A. FIG. 10 is a schematic view of part of a display according to another embodiment of the disclosure. The differences between the embodiment shown in FIG. 10 and the embodiment shown in FIG. 9 are that magnets 130 is in a larger quantity in FIG. 10 (illustrated as two), and that each magnet 130 arranged along a direction D1 is in a smaller size in FIG. 10.

In other embodiments, a flexible display panel may have a different disposition to be driven to move or to be rolled and collected in a way similar to the aforementioned embodiments. Examples are taken to explain the disclosure as follows by the drawings.

Figure 11A:
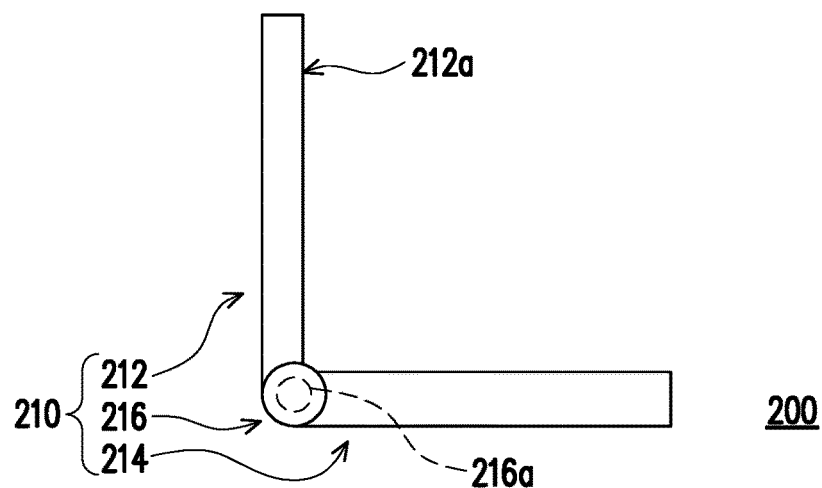
FIG. 11A is a schematic view of a display according to another embodiment of the disclosure.
Figure 11B:
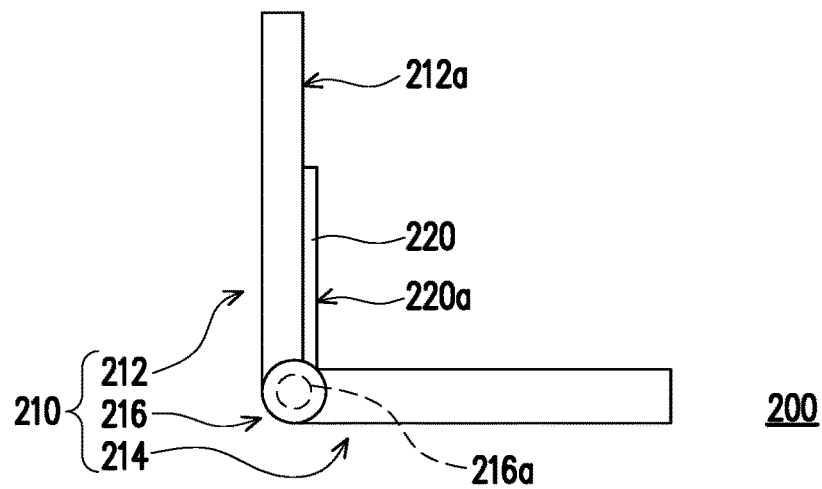
FIG. 11B and FIG. 11C illustrate a flexible display panel moving relatively to a body according to FIG. 11A.
Figure 11C:
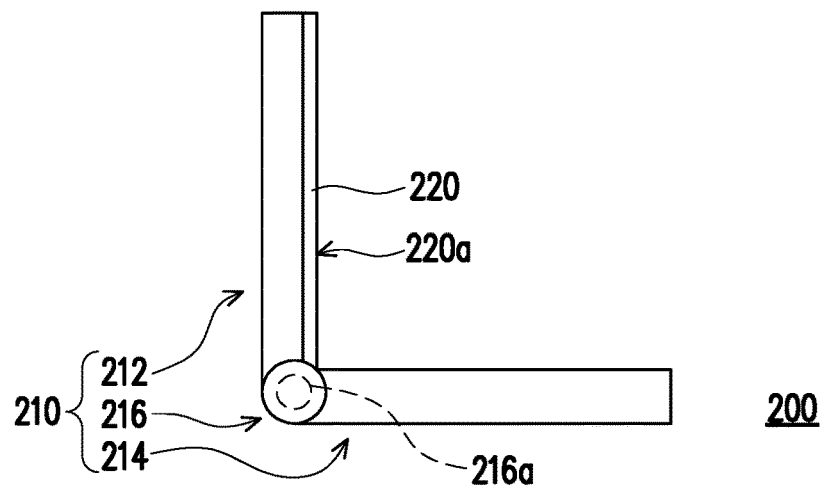
Figure 12:
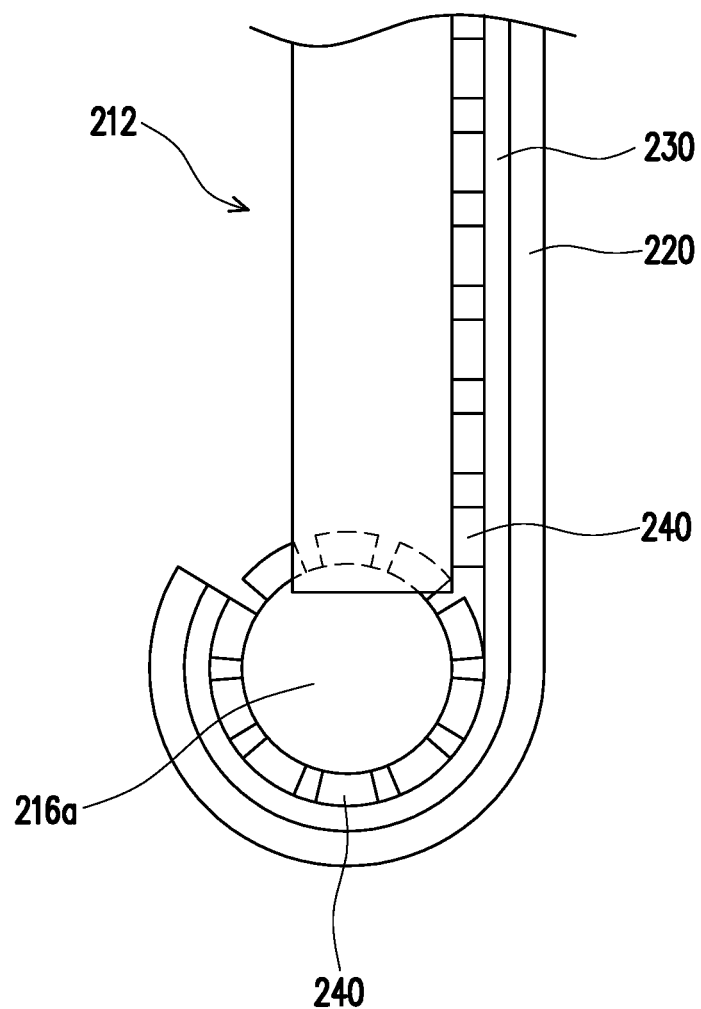
FIG. 12 illustrates part of the flexible display panel according to FIG. 11C rolled in a roller.

FIG. 11A is a schematic view of a display according to another embodiment of the disclosure. FIG. 11B and FIG. 11C illustrate a flexible display panel moving relatively to a body according to FIG. 11A. FIG. 12 illustrates part of the flexible display panel according to FIG. 11C being rolled and collected to a roller. Referring to FIG. 11A to FIG. 12, a display 200 of the present embodiment may be, for example, a notebook computer, and includes a carrying main body 210 and a flexible display panel 220. The carrying main body 210 includes two bodies 212 and 214, a pivot 216, and a roller 216a. The roller 216a is disposed within the pivot 216. The body 212 may be, for example, a screen of the notebook computer, and the body 214 may be, for example, a host of the notebook computer. The two bodies 212 and 214 are pivotally connected to each other by the pivot 216. The flexible display panel 220 is adapted to be rolled and collected to the roller 216a and is adapted to unfold from the roller 216a onto the body 212. By doing so, a user may switch a display interface into a display surface 212a of the body 212 itself (as shown in FIG. 11A), switch the display interface into a display surface 220a of the flexible display panel 220 (as shown in FIG. 11C), or use respectively the display surface 220a of the flexible display panel 220 and the display surface 212a of the body 212 itself as parts of the display interfaces (as shown in FIG. 11B) according to his needs.

Similar to the embodiment shown in FIG. 8A to FIG. 8C which includes the magnets 130 and the electromagnets 140, the display 200 of the present embodiment includes a magnet 230 and a plurality of electromagnets 240 as shown in FIG. 12, in which part of the electromagnets 240 is disposed to the roller 216a, the other part of the electromagnets 240 is disposed to the body 212, and the electromagnets 240 drive the magnet 230 and the flexible display panel 220 to move by changing magnetic poles of the electromagnets 140 as shown in the embodiment of FIG. 8A to FIG. 8C, such that the flexible display panel 220 may be rolled and collected to the roller 216a or unfold on the body 212 accordingly. It should be clarified that the structures illustrated in FIG. 11A to FIG. 12 are merely for exemplary purposes as the members may come in other relative sizes and other relative relations of locations suitable for the flexible display panel 220 to be rolled and collected to the roller 216a smoothly or to unfold from the roller 216a onto the body 212 smoothly. In addition, a suitable guiding structure may be further disposed in the pivot 216 to be in cooperation with the change in magnetic poles of the electromagnets 240 to guide the flexible display panel 220 to be rolled and collected.

In sum of the above, in a display of the disclosure, a carrying main body is disposed with electromagnets and a flexible display panel is disposed with magnets, such that the flexible display panel may not be disengaged from the carrying main body with magnetic attraction between the electromagnets and the magnets. The flexible display panel may be disposed to unfold or fold between the two bodies along with the opening and closing of the two bodies. With such disposition, magnetic poles of each electromagnet may be changed, and with magnetic repulsion produced by part of the electromagnets toward the magnets on the flexible display panel, the flexible display panel may glide relatively to the body, such that the two bodies and the flexible display panel may unfold and close smoothly. Accordingly, it is not necessary to dispose a sliding track at the bezel of the body for the flexible display panel to glide, thereby decreasing the thickness of the body at the bezel and also avoiding abrasion of the side margins of the flexible display panel at the sliding track. In addition, since the gliding stroke of the flexible display panel is controlled according to the set change in magnetic poles of the electromagnets, the location where the flexible display panel bends may be avoided to change. Furthermore, the flexible display panel may be disposed to be adapted to be rolled and collected to the roller or to unfold from the roller onto the body. With such disposition, magnetic poles of each electromagnet may be changed, and, with magnetic repulsion produced by part of the electromagnets toward the magnets on the flexible display panel, the flexible display panel may glide relatively to the body and the roller, such that the flexible display panel may unfold and close smoothly.

Although the disclosure has been disclosed by the above embodiments, it will be apparent to one of ordinary skill in the art that modifications to the described embodiments may be made without departing from the spirit of the scope or spirit of the disclosure. In view of the foregoing, the scope of the disclosure will be defined by the attached claims and their equivalents and not by the above detailed descriptions.

What is claimed is:

1. A display, comprising:
   a carrying main body;
   a flexible display panel, disposed to the carrying main body and is adapted to unfold on the carrying main body;
   at least one magnet, disposed on the flexible display panel; and
   a plurality of electromagnets, disposed to the carrying main body, wherein magnetic poles of the electromagnets are adapted to change and drive the at least one magnet and the flexible display panel to move relatively to the carrying main body.

2. The display according to claim 1, wherein the carrying main body comprises two bodies pivotally connected to each other, a first section of the flexible display panel is disposed to one of the two bodies and a second section of the flexible display panel is disposed to the other one of the two bodies, and the flexible display panel is adapted to glide and unfold relatively to the two bodies along with relative unfolding of the two bodies, and is adapted to glide and fold between the two bodies relatively to the two bodies along with relative closing of the two bodies.

3. The display according to claim 2, wherein part of the electromagnets is disposed to one of the two bodies, the other part of the electromagnets is disposed to the other one of the two bodies, the at least one magnet comprises at least two magnets, and the at least two magnets are disposed respectively in the first section of the flexible display panel and the second section of the flexible display panel.

4. The display according to claim 2, wherein the two bodies are pivotally connected to each other along a pivot axis, each of the two bodies has two side margins which are on opposite sides, each of the side margins extends along a direction perpendicular to the pivot axis, and the electromagnets are disposed to at least one of the side margins and are arranged along the direction in sequence.

5. The display according to claim 2, comprising a control element, wherein the control element is adapted to control a change in magnetic poles of the electromagnets along with increase or decrease of an unfolding angle of the two bodies.

6. The display according to claim 5, comprising a sensing element, wherein the sensing element is adapted to sense the unfolding angle.

7. The display according to claim 6, wherein the carrying main body comprises a pivot by which the two bodies are pivotally connected to each other, the sensing element is disposed to the pivot and is adapted to sense a torque value of the pivot, and the torque value is related to the unfolding angle.

8. The display according to claim 1, wherein the carrying main body comprises a roller and a body, and the flexible display panel is rolled and collected to the roller and is adapted to unfold from the roller onto the body.

9. The display according to claim 8, wherein part of the electromagnets is disposed to the roller, and the other part of the electromagnets is disposed to the body.

10. The display according to claim 8, wherein the carrying main body comprises another body and a pivot, the two bodies are pivotally connected to each other by the pivot, and the roller is disposed within the pivot.

11. The display according to claim 1, comprising a control element, wherein the electromagnets are arranged along a direction in sequence, and the control element is adapted to control along the direction in sequence at least part of magnetic poles of the electromagnets to change and drive the at least one magnet and the flexible display panel to move along the direction.

12. The display according to claim 11, wherein a size of the at least one magnet arranged along the direction is bigger than a size of each of the electromagnets arranged along the direction.

13. The display according to claim 1, wherein, in a direction perpendicular to a display surface of the flexible display panel, the at least one magnet overlaps with part of the electromagnets.

* * * * *